United States Patent
Tsai et al.

(10) Patent No.: US 6,174,793 B1
(45) Date of Patent: Jan. 16, 2001

(54) METHOD FOR ENHANCING ADHESION BETWEEN COPPER AND SILICON NITRIDE

(75) Inventors: Cheng-Yuan-Chen Tsai, Pei-Kang Chen; Chih-Chien Liu, Taipei; Juan-Yuan Wu, Hsin-Chu, all of (TW)

(73) Assignee: United Microelectronics Corp., Hsin-Chu (TW)

(*) Notice: Under 35 U.S.C. 154(b), the term of this patent shall be extended for 0 days.

(21) Appl. No.: 09/415,798

(22) Filed: Oct. 11, 1999

(51) Int. Cl.[7] .................. H01L 21/3205; H01L 21/44
(52) U.S. Cl. ................ 438/586; 438/597; 438/622; 438/637; 438/687
(58) Field of Search .................... 438/586, 637, 438/622, 597, 687

(56) References Cited

U.S. PATENT DOCUMENTS

| 5,422,289 | * | 6/1995 | Pierce ........................... 437/32 |
| 5,756,396 | * | 5/1998 | Lee et al. ..................... 438/622 |
| 5,786,273 | * | 7/1998 | Hibi et al. .................... 438/637 |
| 5,877,076 | * | 3/1999 | Dai ............................... 438/597 |
| 6,015,747 | * | 1/2000 | Lopatin et al. ............... 438/586 |

* cited by examiner

Primary Examiner—Richard Elms
Assistant Examiner—Michael S. Lebentritt
(74) Attorney, Agent, or Firm—Harness, Dickey & Pierce, P.L.C.

(57) ABSTRACT

A method for enhancing adhesion ability between copper and silicon nitride is disclosed. The present method comprises following steps: first, provide a substrate and then form a copper layer on the substrate; second, form a copper phosphide layer on the copper layer; and finally, form a silicon nitride layer on the copper phosphide layer. Herein, the copper phosphide layer is formed by a plasma enhanced chemical vapor deposition process. Therefore, any copper oxide layer that covers copper layer is replaced by the silicon phosphide layer and then adhesion between copper and silicon nitride is improved. Moreover, the silicon phosphide comprises two advantages: low resistance than copper oxide and efficiently prevent copper diffuses into surrounding dielectric layer.

20 Claims, 6 Drawing Sheets

METHOD FOR ENHANCING ADHESION BETWEEN COPPER AND SILICON NITRIDE

BACKGROUND OF THE INVENTION

1. Field of the Invention

This invention is in the field of integrated circuits, and is more specifically directed to the application of copper.

2. Description of the Prior Art

In contemporary fabrication of integrated circuits, interconnect usually is formed by metal. Available metals for interconnect must satisfy some requirements such as low resistivity, high resistance to electromigration failure effects, excellent adhesion to underlying substrate material and low film stress, etc.

Among all of the available metals, aluminum is most widely used in the contemporary manufacture of silicon integrated circuits. Advantages of aluminum include low resistivity (2.7 $\mu\Omega$-cm) and good adhesion to silicon dioxide and silicon.

As device dimensions continue to scale down, however, some disadvantages of aluminum such as relatively poor resistance to electromigration effects and corrosion become a bottleneck, and then it is necessary to find other metal for the interconnect.

Because copper has low resistivity (1.7 $\mu\Omega$-cm) and good electromigration resistance, it would thus be a processing interconnect material, especially when device dimensions approach deep-submicron sizes.

However, copper could rapidly diffuse into surrounding dielectric materials, especially into silicon dioxide, due to its nature. Thus, it is necessary to inhibit this diffusion by a diffusion barrier layer to render certainly real profile of copper connect, similar to the desired profile of copper connect. As usual, the diffusion barrier layer is provided by silicon nitride layer which is formed by a plasma enhanced chemical vapor deposition (PECVD) process.

There are, in principal, still two issues about the application of copper and silicon nitride. First, silicon nitride has poor adhesion to copper surfaces, resulting in the peeling of the silicon nitride from the copper surface. Second, copper is easy to be oxidized and then an additional process is required to remove the unwanted copper oxide layer.

Accordingly, it is necessary to overcome these issues to take advantages of the copper connect. Especially when the chemical mechanical polishing process is broadly used to remove excess copper, the lack of properly dry etching does not restrict the application of copper.

SUMMARY OF THE INVENTION

It is an object of the invention to provide a method for enhancing adhesion ability between copper and silicon nitride.

It is another object of the invention to provide such a method that decreases the resistance between copper and conductive structure.

It is still another object of the invention to provide an efficient method to prevent copper from diffusing into surrounding dielectric layer.

It is a further object of the invention to provide a manufacturable fabrication of integrated circuit.

First embodiment is a method for enhancing adhesion ability between copper and silicon nitride. The method comprises four steps: first, provide a substrate; second, form a copper layer on the substrate; third, form an intervening copper phosphide layer on the copper layer; and finally, form a silicon nitride layer on the intervening copper phosphide layer. Moreover, the copper phosphide layer is formed by a plasma enhanced chemical vapor deposition process with PH3 plasma.

As a matter of fact, though copper is easy to react with oxygen but copper oxide also is easy to be removed by reacting with ionized hydrogen gas in PH3 plasma environment. Accordingly, the adhesion of copper phosphide and silicon nitride is essentially better than that of copper and silicon nitride. Therefore, copper phosphide layer that is formed by reaction between phosphorus ions and copper layer can enhance adhesion between copper and silicon nitride without any additional treatment to remove unwanted copper oxide. Beside, application of copper phosphide further comprises two advantages: provide low resistance and prevent copper from diffusing into surrounding dielectric layer.

The second embodiment of the invention is a method for forming a copper interconnect. The presented embodiment comprises following steps: provide a substrate that is covered by a first dielectric layer and then form a first silicon nitride layer and a second dielectric layer on the first dielectric layer in sequence. Form a gap in both second dielectric layer and first silicon nitride layer by a photolithography process and an etching process, and then cover second dielectric layer by a copper layer, wherein copper layer substantially fills the gap. Then remove the copper layer by a chemical mechanical polishing process, wherein the gap is still substantially filled by the copper layer. Sequentially, form a copper phosphide layer on the gap by a PECVD process with a PH3 plasma and then form a second silicon nitride layer on the second dielectric layer and covers the copper phosphide layer. Finally, form a third dielectric layer on the second silicon nitride layer.

As a summary, one of the main characteristics of the invention is that copper phosphide is used to connect copper and silicon nitride, and any copper oxide layer on the copper layer can be automatically replaced by the copper phosphide layer. By the way, not only the adhesion of silicon nitride to copper is improved by copper phosphide but also copper phosphide act as both a blocking layer of copper and a low resistivity interface between copper and conductive structure (such as contact).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

To compare the proposed invention and conventional fabrication of integrated circuit, especially to clearly point out the characteristics of the invention, the conventional fabrication of copper layer (copper film or copper line) is disclosed here.

Figure 1A:
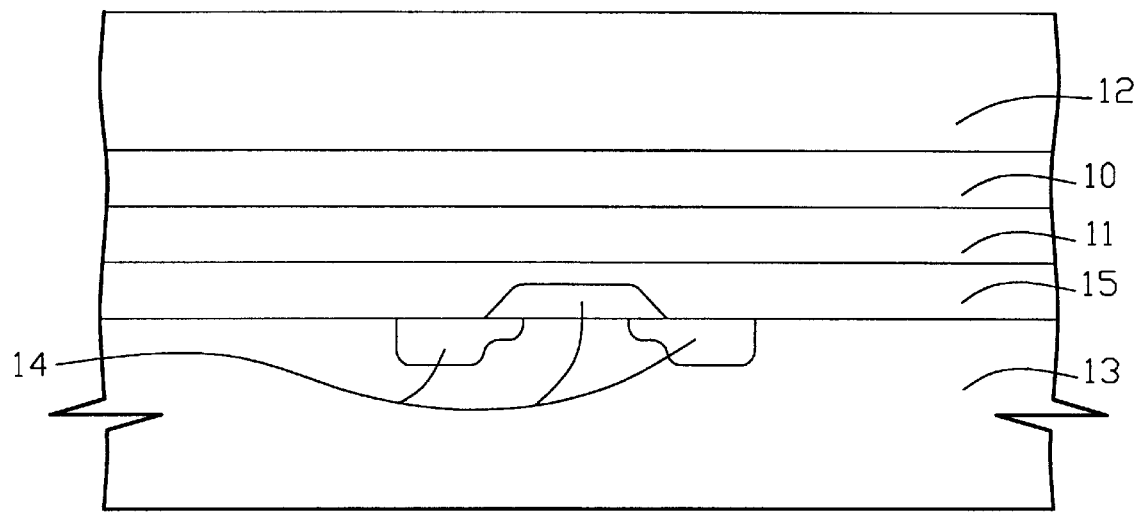
FIG. 1A and FIG. 1B briefly show the cross-section illustrations about conventional fabrication of copper layer.

As FIG. 1A shows, silicon nitride layer 10 is formed between copper layer 11 and first dielectric layer 12. In addition, copper layer 11 is formed on substrate 13 that comprises field effect transistor 14, and is covered by second dielectric layer 15. Moreover, silicon nitride layer 10 is used to prevent copper from diffusing into surrounding first dielectric layer 12 and second dielectric layer 15.

Figure 1B:
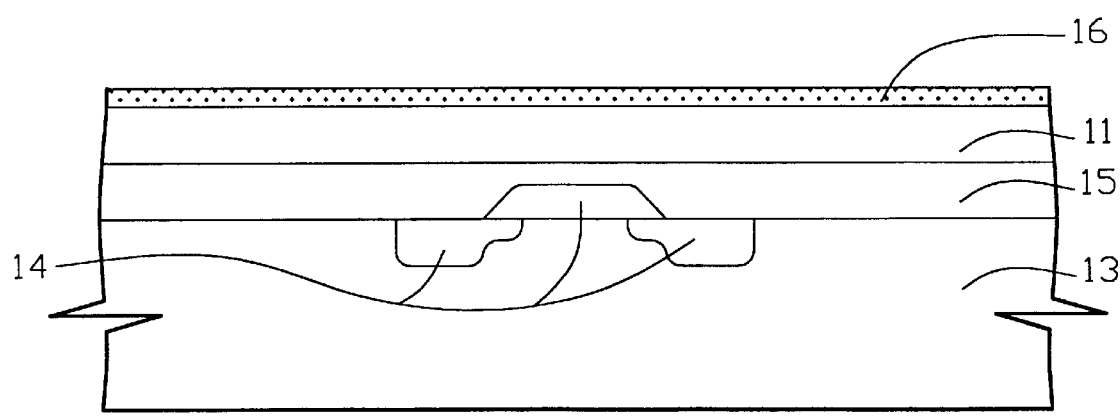

However, owing to the fact that copper layer 11 is easy to be oxidized whenever it is exposed to air (or in detail, oxygen), and the oxidation will be happened due to the thermodynamically spontaneous reaction. Thus, during fabricating process wafer is transferred from a reactor to another reactor and is possibly exposed to air during the transferring process, then as shown in FIG. 1B, copper oxide layer 16 is formed on copper layer 11, where thickness of said copper oxide layer 16 is about 50 to 100 angstroms.

No matter how, since resistivity of copper oxide layer 16 is much higher than copper layer 11, it is obvious that copper oxide layer 16 is unwanted and is necessary to remove copper oxide layer 16 before silicon nitride layer 10 being formed. In other words, fabrication of integrated circuit is protected but also becomes complicated.

However, even copper oxide layer 16 is removed, conventional fabrication still has a serious disadvantage: the adhesion between cooper layer 11 and silicon nitride layer 10 is poor, especially when silicon nitride layer 10 is formed by a PECVD process. Therefore, silicon nitride layer 10 might be peeled from copper layer 11 and can not efficiently prevent copper from diffusing into first dielectric layer 12.

Additionally, though the FIG. 1A and FIG. 1B only illustrate the case that silicon oxide layer 10 is formed on copper layer 11, these disadvantages mentioned above still exist when silicon oxide layer 10 is positioned below or adjacent to copper layer 11.

In order to overcome previous disadvantages, a method for enhancing adhesion between copper and silicon nitride is proposed. The proposed method comprises four steps and is explained in following paragraphs with FIG. 2A to FIG. 2D.

Figure 2A:
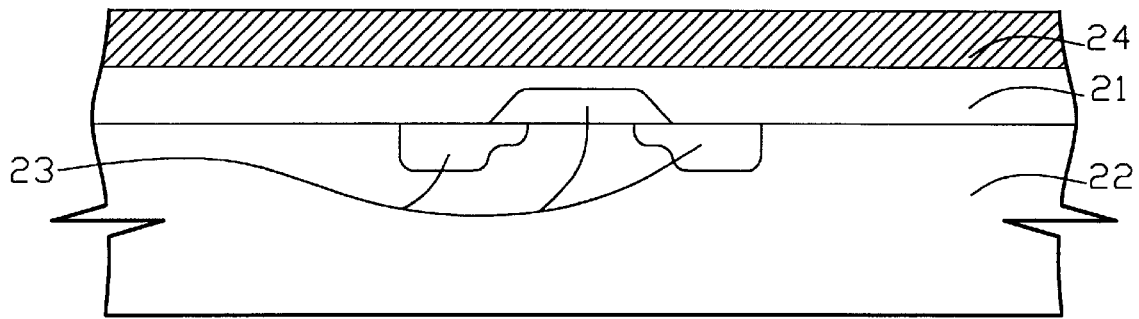
FIG. 2A to FIG. 2D are four brief cross-section illustrations about fabricating steps of a method for enhancing adhesion between copper and silicon nitride, herein the method is in accordance with an embodiment of the invention.

As shown in FIG. 2A, substrate 22 is provided and is covered by dielectric layer 21. And then copper layer 24 is formed on substrate 22. Herein, substrate 22 comprises a plurality of structures that formed in and on substrate 22, and possible structures comprise transistor 23, contact and dielectric layer. Moreover, possible varieties of dielectric layer 21 comprise silicon dioxide layer and silicon nitride layer.

Figure 2B:
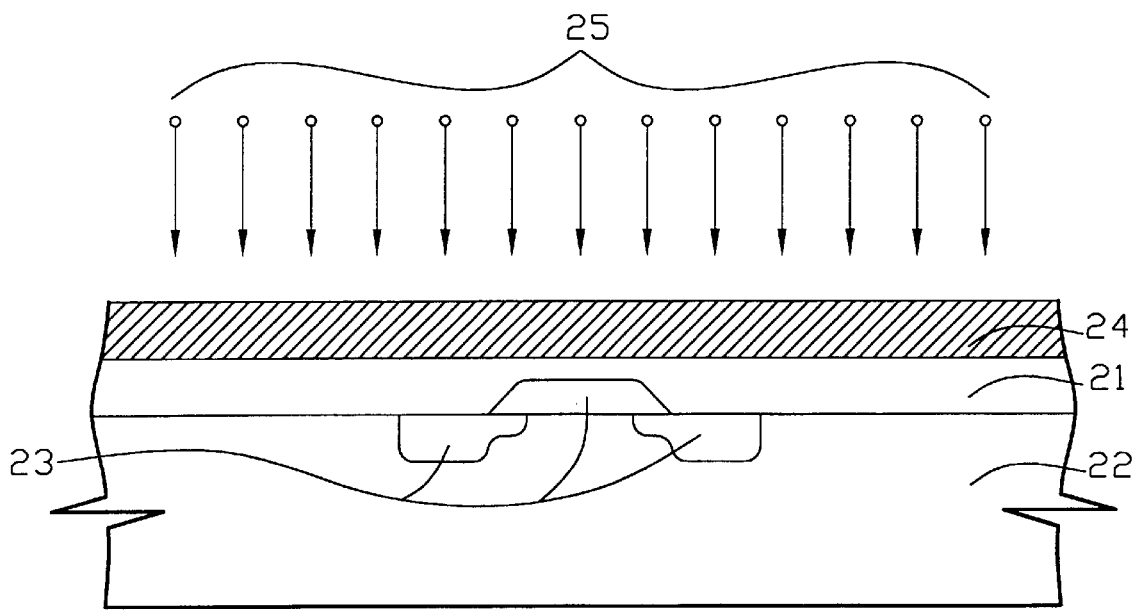

A condition that no copper oxide layer is formed on copper layer 24 is illustrated, as shown in FIG. 2B. A plasma enhanced chemical vapor deposition process is used to treat copper layer 24, herein PH3 plasma 25 reacts with copper layer 24, and then a copper phosphide layer will be formed.

Figure 2C:
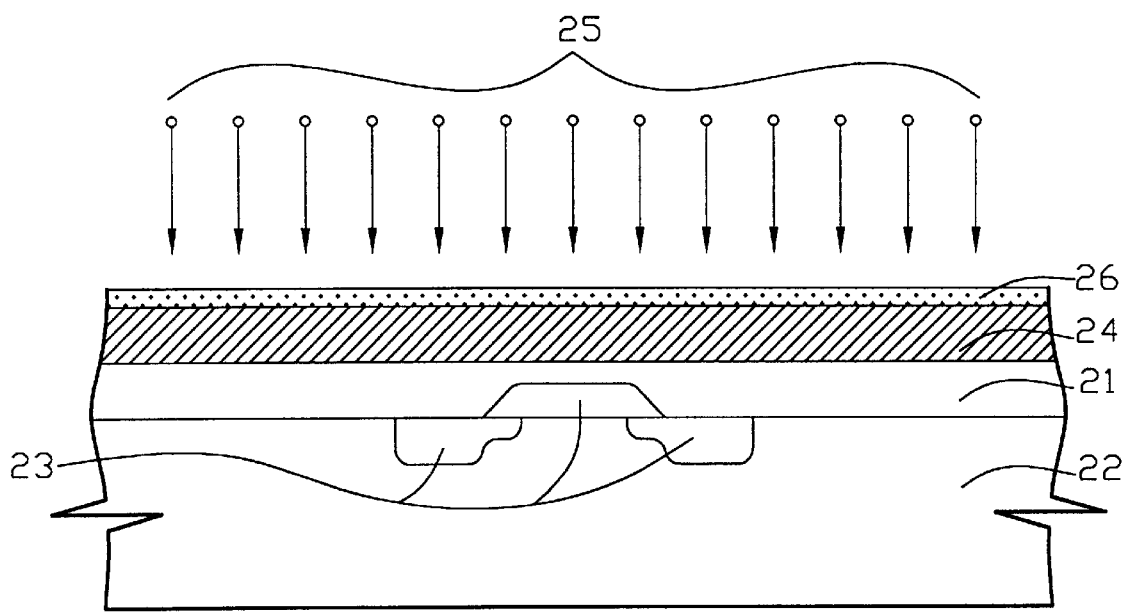

Another condition that copper oxide layer 26 is located on copper layer 24 is illustrated. Copper oxide layer 26 is an product of a transferring process that substrate 21 is moved from a reactor to another reactor, and thickness of said copper oxide layer is about 50 to 100 angstroms. In the case as shown in FIG. 2C, a plasma enhanced chemical vapor deposition process is used to treat copper layer 24. Moreover, as in the previous case, PH3 plasma 25 reacts with copper layer 24 and copper oxide layer 26, and then copper oxide layer 26 will be replaced by a copper phosphide layer.

It is known that ionized PH3 gas can efficiently form copper phosphide layer, no matter whether direct react with copper layer 24 or reduce copper oxide layer 26. By the way, whether copper layer 24 is covered by copper oxide layer 26 or not, a PECVD process with ionized PH3 gas is an excellent way to form copper phosphide layer on copper layer 24.

Additionally, a typical temperature of the plasma enhanced chemical vapor deposition process is about 400° C., and a typical pressure of the plasma enhanced chemical vapor deposition process is about 1 torr to 10 torrs.

Figure 2D:
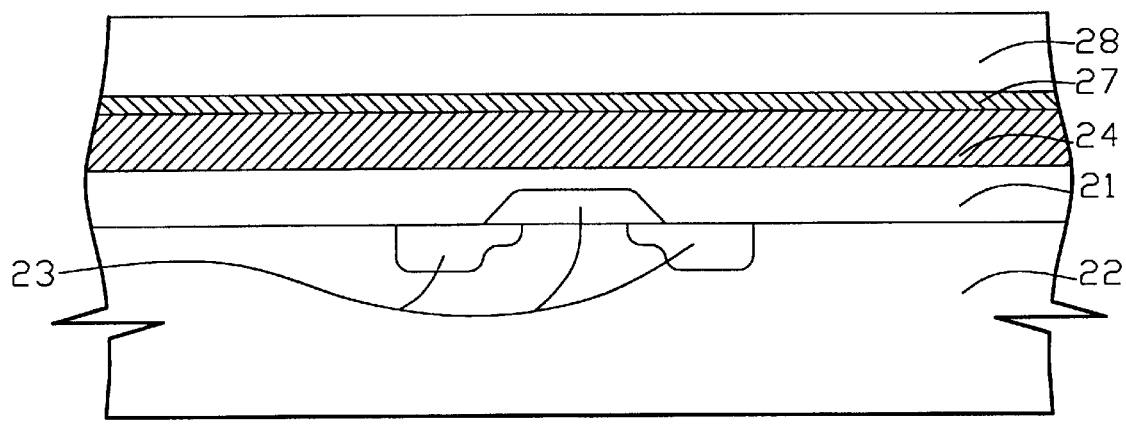

Then, as shown in FIG. 2D, intervening copper phosphide layer 27 is formed on copper layer 24, and then silicon nitride layer 28 is formed on intervening copper phosphide layer 27. Herein, silicon nitride layer 28 also is formed by plasma enhanced chemical vapor deposition process.

Obviously, the key point of the embodiment is copper layer 24 and silicon nitride layer 28 is separated by intervening copper phosphide layer 27. Thus, the net adhesion between copper layer 24 and silicon nitride layer 28 is summation of adhesion between copper layer 24 and copper phosphide layer 27 and adhesion between copper phosphide layer 27 and silicon nitride layer 28.

Herein, copper phosphide layer 27 not only can provide a rough interface between copper layer 24 and silicon nitride layer 28, but also can provide a series of diffusion bonding in the interface between copper layer 24 and silicon nitride layer 28. Therefore, the adhesion between copper and silicon nitride is efficiently enhanced by copper phosphide layer 27. Whereby these advantages can be proven by cross-section transmission electron microscopy (X-TEM).

Beside, copper phosphide layer 27 is formed by a PECVD process that can efficiently replace copper oxide layer 26. Therefore, the existence of copper oxide layer 26 will not induce any disadvantage except the forming period is protracted. And then no additional reduction treatment is required to remove copper oxide layer. In other word, owing to the fact that elimination of copper oxide layer 26 and formation of copper phosphide layer 27 can be performed simultaneously, and the resistivity of copper phosphide layer 27 is much smaller than resistivity of copper oxide layer 26. According to the proposed method, copper layer 24 is treated more efficient and excellent than conventional fabrication.

Anyway, another advantage of copper phosphide layer 27 is that it can prevent copper from diffusing into surrounding dielectric layer. In other words, copper phosphide layer 27 can act as a blocking layer and then the requirement of diffusion barrier is decreased.

Figure 3A:
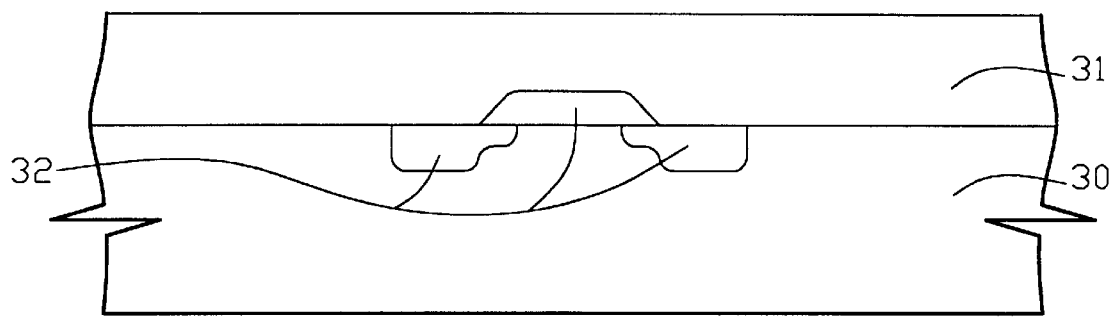
FIG. 3A to FIG. 3F are six brief cross-section illustrations about fabricating steps of a method for forming a copper interconnect, herein the method is in accordance with another embodiment of the invention.

Second embodiment disclosed in here is a method for forming a copper interconnect. The present method is illustrated by FIG. 3A to FIG. 3F and comprises following steps:

As shown in FIG. 3A, substrate 30 is provided and covered by first dielectric layer 31. Herein, substrate 30 comprises field effect transistor 32 and further comprises contact, isolation and capacitor.

Figure 3B:
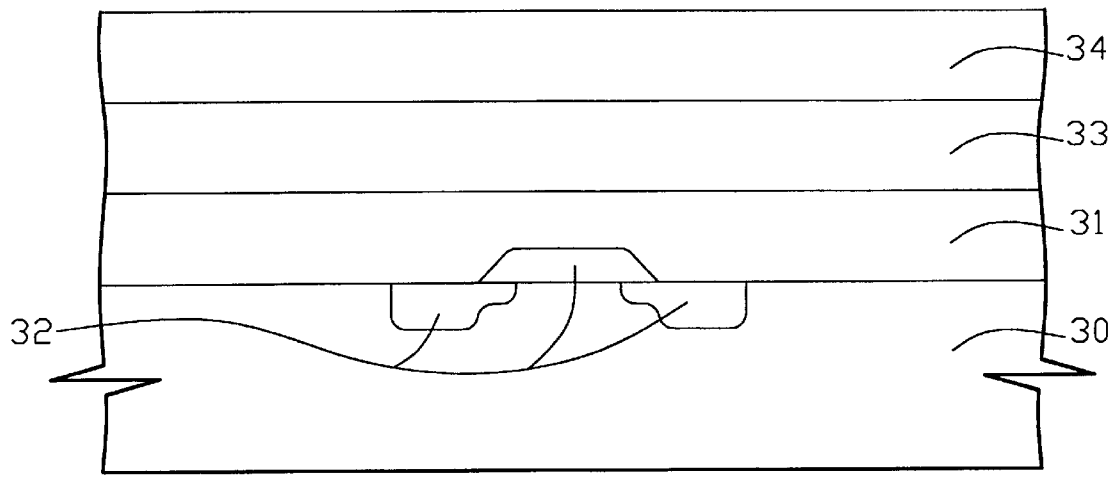

As shown in FIG. 3B, first silicon nitride layer 33 is formed on first dielectric layer 31 and second dielectric layer 34 is formed on first silicon nitride layer 33. Herein, possible varieties of second dielectric layer 34 comprise silicon dioxide layer.

Figure 3C:
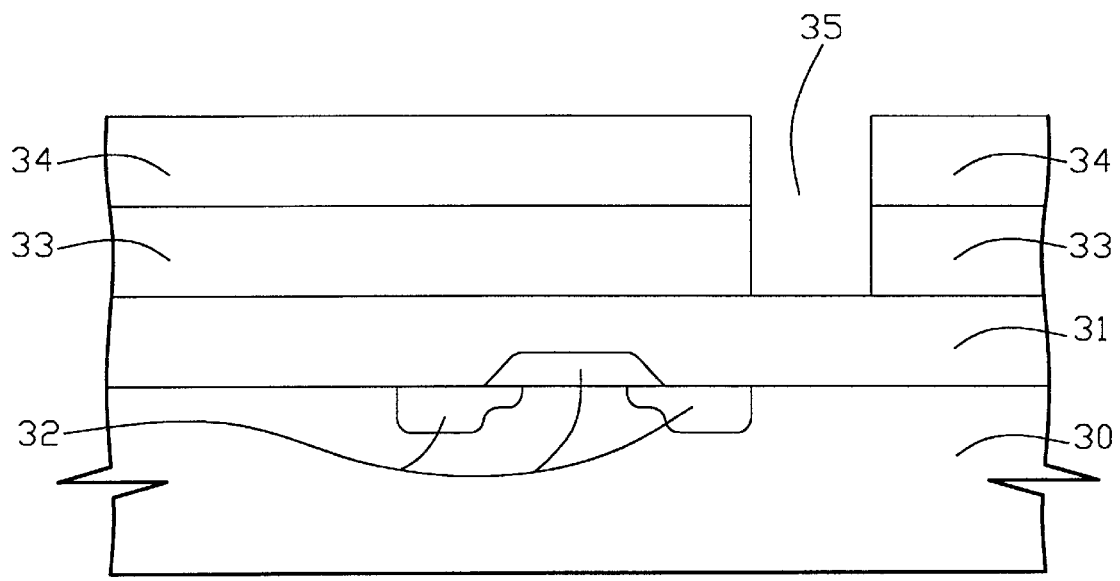

As shown in FIG. 3C, gap 35 is formed in both second dielectric layer 34 and first silicon nitride layer 33, herein both a photolithography process and an etching process are used.

Figure 3D:
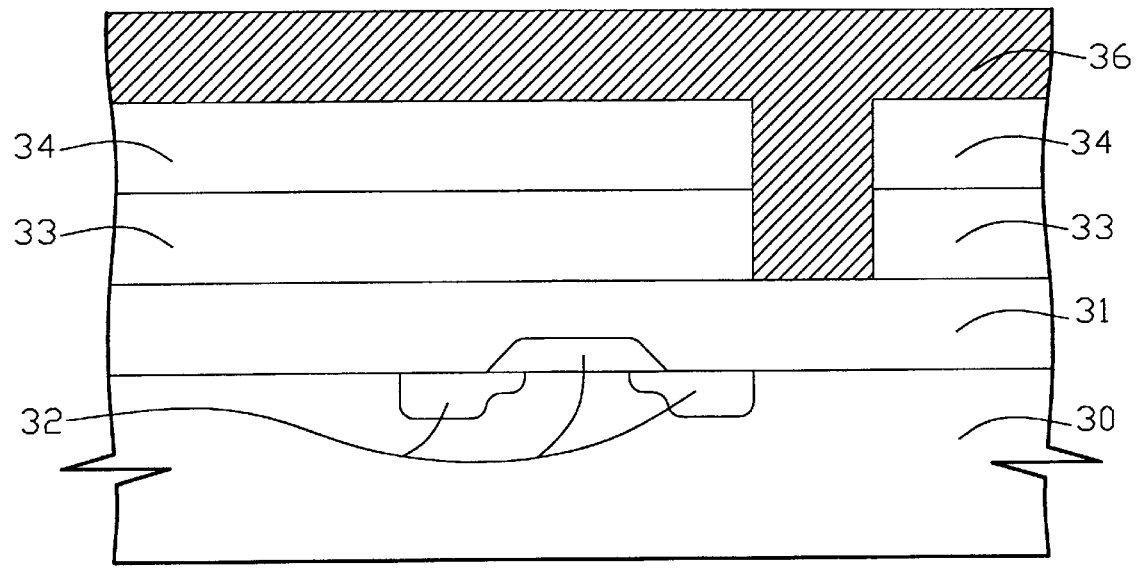

As shown in FIG. 3D, second dielectric layer 34 is covered by copper layer 36, wherein copper layer 36 also substantially fills gap 35.

Figure 3E:
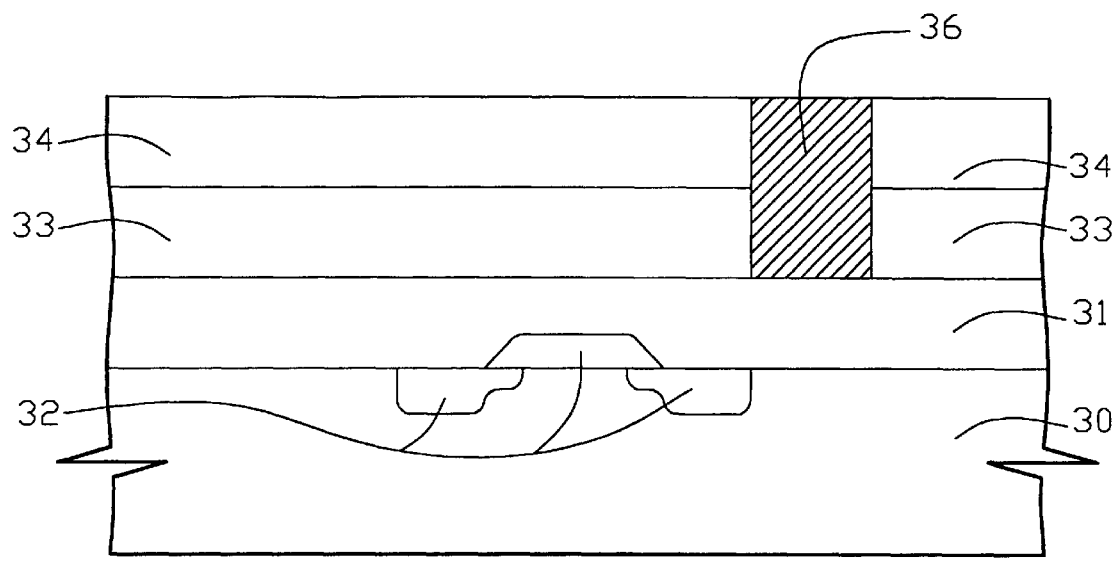

As shown in FIG. 3E, copper layer 36 is removed by a chemical mechanical polishing process, wherein gap 35 is still substantially filled by copper layer 36.

Figure 3F:
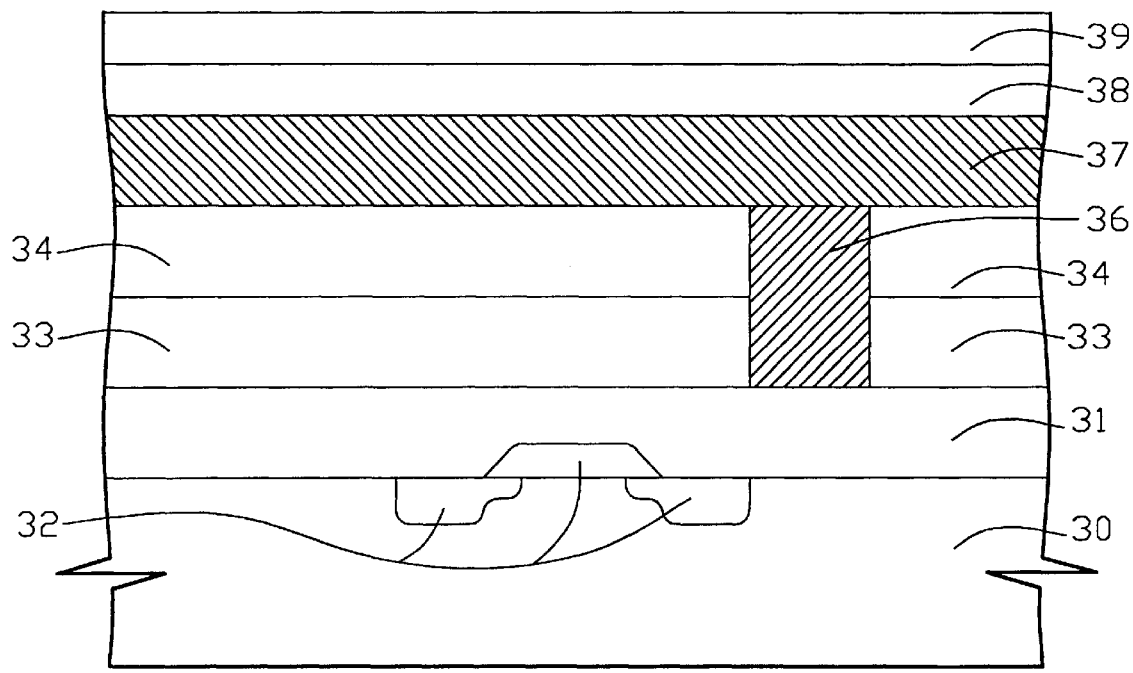

As shown in FIG. 3F, copper phosphide layer 37 is formed on second dielectric layer 34, where copper phosphide layer 37 also covers gap 35. Then second silicon nitride layer 38 is formed on copper phosphide layer 37, and third dielectric layer 39 is formed on second silicon nitride layer 38. Moreover, copper phosphide layer 37 is formed by a plasma enhanced chemical vapor deposition process. Herein, a typical temperature of the plasma enhanced chemical vapor deposition process is about 400° C. and a typical pressure of said plasma enhanced chemical vapor deposition process is about 1 torr to 10 torrs. Beside, PH3 plasma is used by the plasma enhanced chemical vapor deposition process.

In addition, the embodiment further comprises during a transferring process that substrate 30 is moved from a reactor to another reactor, a copper oxide layer is formed on copper layer 36 before copper phosphide layer 37 is formed.

Of course, copper oxide layer is not object of the prevent embodiment, but only is a unwanted sideproduct of the transferring process and thickness of the copper oxide layer is about 50 to 100 angstroms. No matter how, owing to the fact that copper oxide layer can be substantially replaced by copper phosphide layer 37 during the PECVD process, the existence of copper oxide layer does not obviously affect these steps of the embodiment. Thus, the only change of these steps is the period of the PECVD is protracted to substantially replace copper oxide layer by phosphide layer 37.

Obviously, the present method can form required copper interconnect by properly define the profile of gap 35 and then residuary copper layer 36 that located in gap 35 will be the required copper interconnect.

Significantly, the present embodiment corresponds to following advantages: First, resistivity between copper interconnect and any connected conductive structure, such as contact, would not be degraded by copper oxide layer. Second, adhesion between copper interconnect and any surrounding dielectric layer is efficiently enhanced by copper phosphide layer 37. Third, copper phosphide layer 37 can prevent copper from diffusing into second silicon nitride layer 38 and third dielectric layer 39.

While the invention has been described by previous embodiment, the invention is not limited there to. To the contrary, it is intended to cover various modifications and the scope of these claims therefore should be accorded to the broadest interpretation so as to encompass all such modifications and similar arrangement, procedures and products.

What is claimed is:

1. A method for enhancing adhesion between copper and silicon nitride, said method comprising steps of:
   providing a substrate, wherein said substrate is covered by a dielectric layer;
   forming a copper layer on said dielectric layer;
   forming an intervening copper phosphide layer on said copper layer; and
   forming a silicon nitride layer on said intervening copper phosphide layer.

2. The method according to claim 1, wherein said substrate comprises a plurality of structures that are formed in and on said substrate.

3. The method according to claim 2, wherein said structures comprise a transistor and a contact.

4. The method according to claim 1, further comprising forming said intervening copper phosphide layer between said copper layer and surrounding said dielectric layer.

5. The method according to claim 1, wherein said intervening copper phosphide layer is formed by a first plasma enhanced chemical vapor deposition process.

6. The method according to claim 5, wherein an ionized PH3 gas is used by said first plasma enhanced chemical vapor deposition process.

7. The method according to claim 5, wherein temperature of said first plasma enhanced chemical vapor deposition process is about 400° C.

8. The method according to claim 5, wherein pressure of said first plasma enhanced chemical vapor deposition process is about 1 torr to 10 torrs.

9. The method according to claim 1, wherein said silicon nitride layer is formed by a second plasma enhanced chemical vapor deposition process.

10. The method according to claim 1, further comprising a copper oxide layer that is formed on said copper layer before said intervening copper phosphide layer is formed.

11. The method according to claim 10, wherein thickness of said copper oxide layer is about 50 to 100 angstroms.

12. The method according to claim 10, wherein said copper oxide layer is removed by said first plasma enhanced chemical vapor deposition process.

13. A method for forming a copper interconnect, said method comprising steps of:
   providing a substrate, wherein said substrate is covered by a first dielectric layer, and wherein said substrate comprises a field effect transistor;
   forming a first silicon nitride layer on said first dielectric layer;
   forming a second dielectric layer on said first silicon nitride layer;
   removing a portion of said second dielectric layer and said first silicon nitride layer to form a gap on said first dielectric layer, wherein a photolithography process and an etching process are used;
   covering said second dielectric layer by a copper layer, wherein said copper layer substantially fills up said gap;
   removing said copper layer by a chemical mechanical polishing process, wherein said gap is substantially filled by residue of said copper layer;
   forming a copper phosphide layer on said second dielectric layer, wherein said copper phosphide layer also covers residue of said copper layer;
   forming a second silicon nitride layer on said copper phosphide layer; and
   forming a third dielectric layer on said second silicon nitride layer.

14. The method according to claim 13, wherein said copper phosphide layer is formed by a plasma enhanced chemical vapor deposition process.

15. The method according to claim 14, wherein an ionized PH3 gas is used by said plasma enhanced chemical vapor deposition process.

16. The method according to claim 14, wherein temperature of said plasma enhanced chemical vapor deposition process is about 400° C.

17. The method according to claim 14, wherein pressure of said plasma enhanced chemical vapor deposition process is about 1 torr to 10 torrs.

18. The method according to claim 13, further comprising a copper oxide layer, wherein said copper oxide layer is formed on said copper layer, and wherein said copper oxide layer is formed before said copper phosphide layer is formed.

19. The method according to claim 18, wherein thickness of said copper oxide layer is about 50 to 100 angstroms.

20. The method according to claim 18, wherein said copper oxide layer is removed by said first plasma enhanced chemical vapor deposition process.

* * * * *